(12) United States Patent
Kim et al.

(10) Patent No.: US 9,911,612 B2
(45) Date of Patent: Mar. 6, 2018

(54) METHODS OF MANUFACTURING SEMICONDUCTOR DEVICES INCLUDING IMPURITY REGIONS

(71) Applicant: SAMSUNG ELECTRONICS CO., LTD., Suwon-si, Gyeonggi-do (KR)

(72) Inventors: Choong-Yeol Kim, Seoul (KR); Myung-Beom Park, Hwaseong-si (KR); Han-Gyul Ko, Seoul (KR); Hwi-Hyeon Oh, Hwaseong-si (KR); Hye-Young Jin, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/058,183

(22) Filed: Mar. 2, 2016

(65) Prior Publication Data

US 2017/0004971 A1    Jan. 5, 2017

(30) Foreign Application Priority Data

Jul. 2, 2015 (KR) ........................ 10-2015-0094669

(51) Int. Cl.
| | |
|---|---|
| *H01L 21/265* | (2006.01) |
| *H01L 21/425* | (2006.01) |
| *H01L 29/06* | (2006.01) |
| *H01L 21/266* | (2006.01) |
| *H01L 29/66* | (2006.01) |
| *H01L 21/8238* | (2006.01) |

(Continued)

(52) U.S. Cl.
CPC .......... *H01L 21/2658* (2013.01); *H01J 37/00* (2013.01); *H01L 21/265* (2013.01); *H01L 21/266* (2013.01); *H01L 21/26506* (2013.01); *H01L 21/26513* (2013.01); *H01L 21/823814* (2013.01); *H01L 29/0623* (2013.01); *H01L 29/1083* (2013.01); *H01L 29/66492* (2013.01); *H01L 29/66575* (2013.01); *H01J 37/08* (2013.01); *H01J 37/3171* (2013.01)

(58) Field of Classification Search
CPC .. H01J 37/3171; H01J 37/08; H01J 2237/006; H01J 2237/31701; H01J 2237/08; H01L 21/265–21/26513; H01L 21/2658; H01L 21/26506; H01L 21/823814
See application file for complete search history.

(56) References Cited

U.S. PATENT DOCUMENTS

| | | |
|---|---|---|
| 7,586,109 B2 | 9/2009 | Perel et al. |
| 7,973,293 B2 | 7/2011 | Lin et al. |

(Continued)

FOREIGN PATENT DOCUMENTS

| | | |
|---|---|---|
| JP | 08-280253 A | 10/1996 |
| JP | 10-163123 A | 6/1998 |
| KR | 10-2001-0109637 A | 12/2001 |

*Primary Examiner* — Marvin Payen
*Assistant Examiner* — Jeremy Joy
(74) *Attorney, Agent, or Firm* — Lee & Morse, P.C.

(57) ABSTRACT

In a method of manufacturing a semiconductor device, a semiconductor substrate is prepared. Boron-containing ions are generated by reacting a borane-based compound and a halogen-containing source with each other. The borane-based compound includes boron having a mass number of 11 ($^{11}B$). The boron-containing ions are implanted into the semiconductor substrate to form an impurity region.

16 Claims, 18 Drawing Sheets

(51) Int. Cl.
*H01J 37/00* (2006.01)
*H01L 29/10* (2006.01)
H01J 37/317 (2006.01)
H01J 37/08 (2006.01)

(56) References Cited

U.S. PATENT DOCUMENTS

| | | |
|---|---|---|
| 8,598,022 B2 | 12/2013 | Kaim et al. |
| 8,642,135 B2 | 2/2014 | Qin et al. |
| 8,937,003 B2 | 1/2015 | Perel et al. |
| 8,975,603 B2 | 3/2015 | Qin et al. |
| 9,006,059 B2 | 4/2015 | Sun |
| 2004/0002202 A1* | 1/2004 | Horsky .............. H01L 21/26513 438/515 |
| 2005/0163693 A1* | 7/2005 | Spielvogel ................ C01B 6/10 423/294 |
| 2006/0097193 A1* | 5/2006 | Horsky .................. H01J 37/08 250/492.21 |
| 2006/0177976 A1* | 8/2006 | Lenoble .............. H01L 21/2236 438/202 |
| 2007/0045227 A1 | 3/2007 | Wu et al. |
| 2007/0141801 A1* | 6/2007 | Kwon ................ H01L 27/1463 438/400 |
| 2007/0178678 A1* | 8/2007 | Hatem .................... C23C 14/48 438/513 |
| 2007/0221956 A1* | 9/2007 | Inaba ................ H01L 21/82380 257/197 |
| 2008/0121811 A1* | 5/2008 | Horsky ................... C23C 14/48 250/424 |
| 2008/0122005 A1* | 5/2008 | Horsky ............... H01L 21/2658 257/369 |
| 2008/0248597 A1* | 10/2008 | Qin ........................ H01L 22/12 438/5 |
| 2008/0248636 A1* | 10/2008 | Olander .................. H01J 37/08 438/515 |
| 2010/0099243 A1* | 4/2010 | Hwang ............. H01L 21/26513 438/514 |
| 2010/0112795 A1* | 5/2010 | Kaim ...................... H01J 37/08 438/515 |
| 2010/0154835 A1* | 6/2010 | Dimeo .................. C23C 14/564 134/31 |
| 2011/0079241 A1* | 4/2011 | Sinha ...................... C23C 14/48 134/1.1 |
| 2011/0097882 A1* | 4/2011 | Kaim ..................... C01B 35/061 438/513 |
| 2011/0143527 A1* | 6/2011 | Platow .................... H01J 37/08 438/515 |
| 2011/0147854 A1* | 6/2011 | Nandakumar .... H01L 21/26506 257/382 |
| 2012/0108044 A1* | 5/2012 | Kaim ..................... C01B 35/00 438/514 |
| 2013/0267083 A1 | 10/2013 | Suguro |
| 2014/0179090 A1 | 6/2014 | Sinha et al. |
| 2014/0301932 A1* | 10/2014 | Byl ....................... C01B 35/061 423/293 |
| 2016/0133427 A1* | 5/2016 | Sinha ..................... H01J 37/3171 250/424 |

* cited by examiner

METHODS OF MANUFACTURING SEMICONDUCTOR DEVICES INCLUDING IMPURITY REGIONS

CROSS-REFERENCE TO RELATED APPLICATION

This application claims priority under 35 USC § 119 to Korean Patent Application No. 10-2015-0094669, filed on Jul. 2, 2015 in the Korean Intellectual Property Office (KIPO), the contents of which are incorporated by reference herein in their entirety.

FIELD

Example embodiments relate to methods of manufacturing semiconductor devices including impurity regions. More particularly, example embodiments relate to methods of manufacturing semiconductor devices including impurity regions formed by an ion-implantation process.

BACKGROUND

Ions may be implanted into a substrate to form an impurity region for a transistor, a contact region, etc., included in a semiconductor device. For example, an ion source including boron (B) may be utilized for a formation of a p-type impurity region.

While performing an ion-implantation process, a subsidiary element or a subsidiary ion source may be provided together with boron for an initial supply of boron. However, an efficiency of the ion-implantation process may be degraded by the subsidiary element or the subsidiary ion source.

SUMMARY

Example embodiments provide a method of manufacturing a semiconductor device including an impurity region with improved efficiency and productivity.

According to example embodiments, there is provided a method of manufacturing a semiconductor device. In the method, a semiconductor substrate may be prepared. Boron-containing ions may be generated by reacting a borane-based compound and a halogen-containing source with each other. The borane-based compound may include boron having a mass number of 11 ($^{11}B$). The boron-containing ions may be implanted into the semiconductor substrate to form an impurity region.

In example embodiments, the borane-based compound may be represented by $^{11}B_xH_y$. Here, x may be an integer equal to or greater than 2, and y may be an integer equal to or greater than 6.

In example embodiments, the halogen-containing source may include at least one of $X_2$, $NX_3$, $ArX_2$, $KrX_2$, $XeX_2$, $NeX_2$ and $HeX_2$, and X may be fluorine (F), chlorine (Cl), bromine (Br), iodine (I) or astatine (At).

In example embodiments, the borane-based compound may include $^{11}B_2H_6$, and the halogen-containing source may include $F_2$.

In example embodiments, in generating the boron-containing ions, a ratio of the number of boron with respect to the number of halogen (B/X) may be adjusted by controlling an amount of the halogen-containing source.

In example embodiments, the borane-based compound and the halogen-containing source may be provided independently and concurrently.

In example embodiments, B/X may be adjusted to be greater than about 1/3.

In example embodiments, B/X may be adjusted to at least about 1/2.

In example embodiments, ions devoid of boron may be also generated by reacting the borane-based compound and the halogen-containing source. A current intensity of the boron-containing ions relatively compared to the ions devoid of boron may be increased by controlling a supply of the halogen-containing source.

In example embodiments, the boron-containing ions may include at least one of $^{11}BX_2^+$, $^{11}BX^+$ and $^{11}B^+$, and X may be F, Cl, Br, I or At.

In example embodiments, the boron-containing ions may include a plurality of ion species having different masses. In implanting the boron-containing ions, a selective implantation may be performed by separating the plurality of ion species according to the masses thereof.

In example embodiments, the impurity region may serve as a well region or a source/drain region.

According to example embodiments, there is provided a method of manufacturing a semiconductor device. In the method, a gate structure may be formed on a substrate. Boron-containing ions may be generated by reacting a borane-based compound and a halogen-containing source with each other. The borane-based compound may include boron having a mass number of 11 ($^{11}B$). The boron-containing ions may be implanted at an upper portion of the substrate adjacent to the gate structure to form an impurity region.

In example embodiments, the boron-containing ions may include a plurality of ions species having different masses. In implanting the boron-containing ions to form the impurity region, a first impurity region in which an ion species having a relatively large mass of the plurality of ion species is implanted may be formed. A second impurity region in which an ion species having a relatively small mass of the plurality of ion species is implanted may be formed. The second impurity region may have a depth greater than that of the first impurity region.

In example embodiments, an isolation layer may be formed on the substrate. An upper portion of the isolation layer may be partially removed to form an active fin that may protrude from a top surface of the isolation layer. The gate structure may cross the active fin on the isolation layer.

In example embodiments, the impurity region may be formed at an upper portion of the active fin adjacent to the gate structure.

In example embodiments, n-type impurities may be implanted at the upper portion of the substrate before implanting the boron-containing ions. The impurity region may serve as a halo region.

According to example embodiments, there is provided a method of manufacturing a semiconductor device. In the method a semiconductor substrate may be prepared. A boron-containing source and a halogen-containing source may be provided independently into a chamber of an ion-implantation apparatus. Boron-containing ions may be generated by reacting the boron-containing source and the halogen-containing source with each other. The boron-containing ions may be implanted into the semiconductor substrate to form an impurity region.

In example embodiments, the boron-containing source may include a borane-based compound containing boron having a mass number of 11 ($^{11}B$), and the halogen-containing source may contain fluorine (F).

In example embodiments, a relative ratio of boron with respect to fluorine may be adjusted to at least about 1/3.

BRIEF DESCRIPTION OF THE DRAWINGS

Example embodiments will be more clearly understood from the following detailed description taken in conjunction with the accompanying drawings.

FIGS. 1 to 3 are cross-sectional views illustrating stages in a method of forming an impurity region in accordance with example embodiments;

FIG. 4 is a schematic view illustrating an ion-implantation apparatus in accordance with example embodiments;

FIGS. 5 to 9 are cross-sectional views illustrating stages in a method of manufacturing a semiconductor device in accordance with example embodiments;

FIGS. 10 to 12 are cross-sectional views illustrating stages in a method of manufacturing a semiconductor device in accordance with example embodiments;

FIGS. 13 to 27 are cross-sectional views illustrating stages in a method of manufacturing a semiconductor device in accordance with example embodiments;

FIG. 28 is a graph showing ion-beam currents of by-product ions according to ratios of boron and fluorine measured in Experimental Example 1; and FIGS. 29 and 30 are graphs showing ion-beam currents of boron-containing ions according to ratios of boron and fluorine measured in Experimental Example 2.

DESCRIPTION OF EMBODIMENTS

Figure 1:
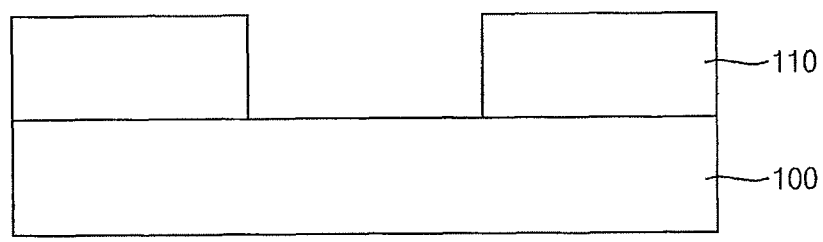
FIGS. 1 to 30 represent non-limiting, example embodiments as described herein.

Various example embodiments will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this description will be thorough and complete, and will fully convey the scope of the embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
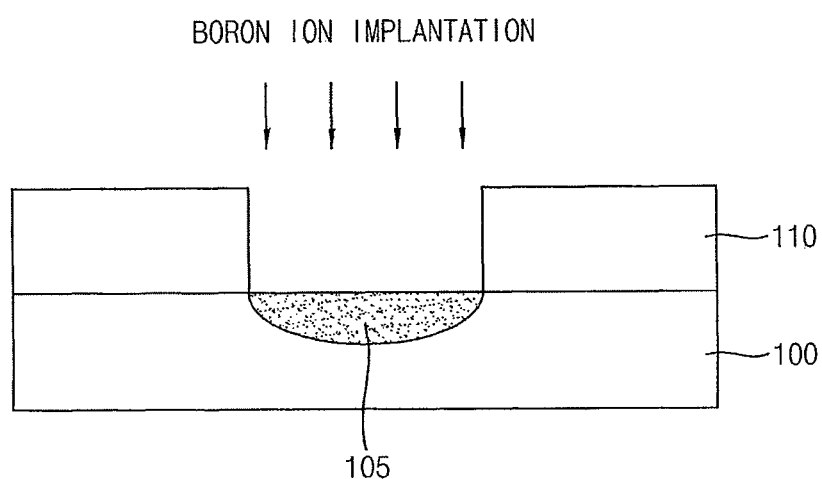
Figure 3:
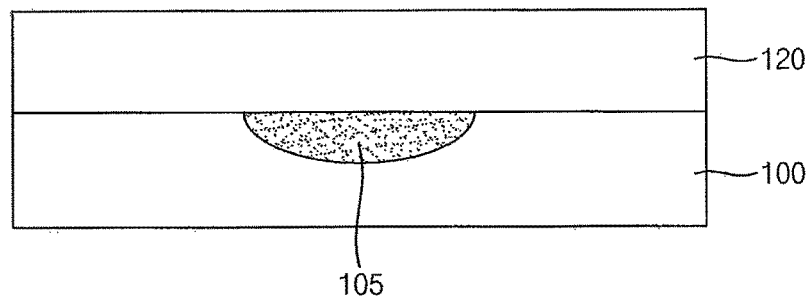
Figure 4:
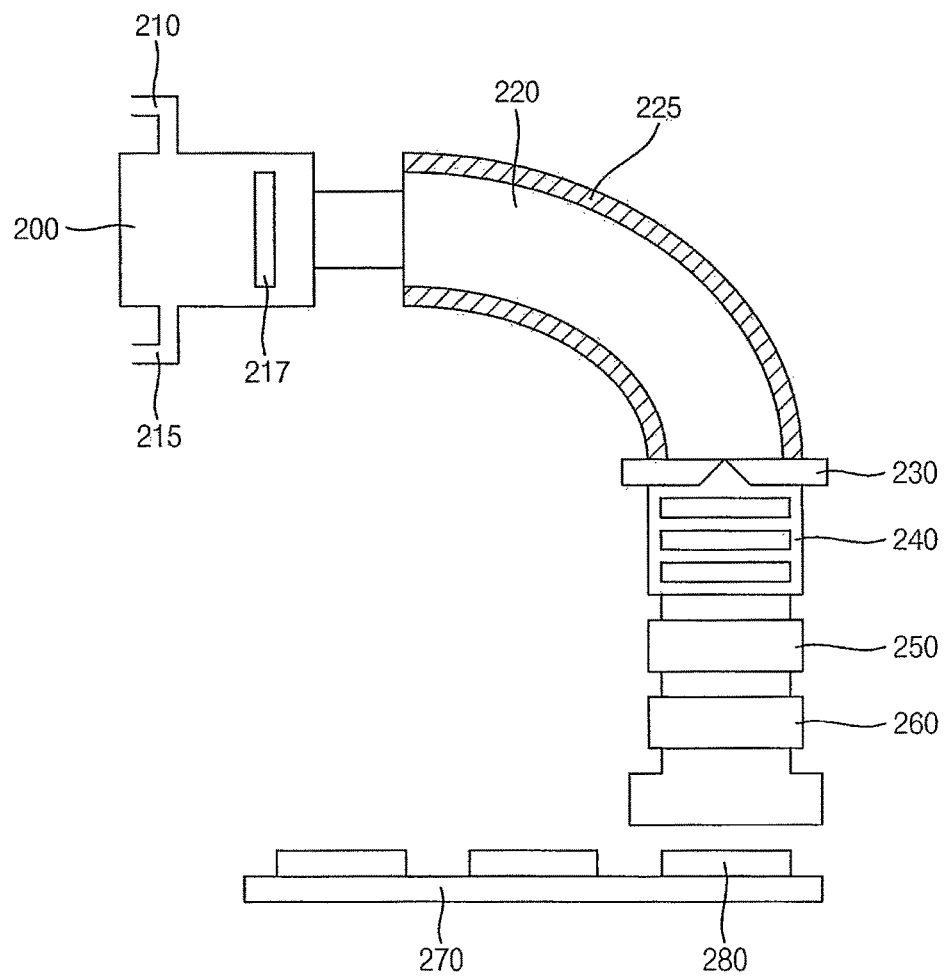

FIGS. 1 to 3 are cross-sectional views illustrating a method of forming an impurity region in accordance with example embodiments. FIG. 4 is a schematic view illustrating an ion-implantation apparatus in accordance with example embodiments Referring to FIG. 1, an ion-implantation mask 110 may be formed on a substrate 100.

A semiconductor substrate, e.g., a silicon substrate, a germanium substrate or a silicon-germanium substrate may be utilized as the substrate 100. In some embodiments, a silicon-on-insulator (SOI) substrate or a germanium-on-insulator (GOI) substrate may be used as the substrate 100. The substrate 100 may include a group III-V compound, e.g., InP, GaP, GaAs, GaSb, or the like.

A lower structure including, e.g., a gate structure and an insulation layer may be formed on the substrate 100.

An upper portion of the substrate 100 may be partially exposed through the ion-implantation mask 110. In example embodiments, the ion-implantation mask 110 may include photoresist.

For example, a photoresist layer may be formed on the substrate 100 by a spin coating process. Exposure and developing processes may be performed on the photoresist layer so that a portion of the photoresist layer may be removed to form the ion-implantation mask 110. The ion-implantation mask 110 may include an opening through which a top surface of the substrate 100 may be exposed.

In some embodiments, a lower coating layer such as a bottom of anti-reflective coating (BARC) layer may be formed before the formation of the photoresist layer. In some embodiments, if the insulation layer is formed on the substrate 100, the insulation layer may be partially etched after the formation of the ion-implantation mask 110 to form the opening.

Referring to FIG. 2, boron (B)-containing ions may be implanted through the opening of the ion-implantation mask 110 to form an impurity region 105 at the upper portion of the substrate 100.

In some embodiments, after the formation of the impurity region 105, a thermal treatment, e.g., an annealing process may be performed to fix the implanted ions.

For example, the boron-containing ions may be implanted using an ion-implantation apparatus illustrated in FIG. 4. However, FIG. 4 only illustrates an exemplary apparatus, and various ion-implantation apparatuses including, e.g., a plasma doping apparatus and a cluster ion-beam apparatus may be also utilized.

The ion-implantation apparatus may include, e.g., an ion source chamber 200, a mass analyzer 220, an ion accelerator 240, an ion lens 250 and a scan plate 260 which may be combined with each other.

A first ion source flow path 210 and a second ion source flow path 215 may be connected to the ion source chamber 200. An electrode 217 (e.g., a cathode) may be placed in the ion source chamber 200 for generating ions from the ion source. An inner wall of the ion source chamber 200 may include a metallic material, e.g., tungsten (W). An exhausting unit may be coupled to the ion source chamber 200 to vacuum the ion source chamber 200.

A magnet 225 may be disposed on an inner wall of the mass analyzer 220. A mass analyzing slit 230 may be interposed between the mass analyzer 220 and the ion accelerator 240.

A plurality of wafers 280 may be placed on a loading plate 270, and the boron-containing ions passing through the scan plate 260 may be implanted onto the wafer 280.

In example embodiments, a boron-containing source and a halogen-containing source may be used together, and may be provided independently. In some example embodiments, the boron-containing source and the halogen-containing source may be introduced concurrently in the ion source chamber 200 through the first ion source flow path 210 and the second ion source flow path 215, respectively.

A borane-based compound that may contain boron having a mass number of 11 ($^{11}B$) may be used as the boron-containing source. In this case, the boron-containing source may be represented by the following Chemical Equation.

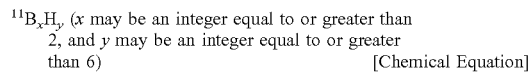

$^{11}B_xH_y$ (x may be an integer equal to or greater than 2, and y may be an integer equal to or greater than 6) [Chemical Equation]

For example, the boron-containing source may be represented as $^{11}B_2H_6$ or $^{11}B_4H_{10}$.

In some embodiments, the halogen-containing source may include, e.g., a fluorine gas ($F_2$), a chlorine gas ($Cl_2$), a bromine gas ($Br_2$), an iodine gas ($I_2$) or an astatine gas ($At_2$). These may be used alone or in a combination thereof.

In some embodiments, the halogen-containing source may include a halogen-containing molecule combined with an inert element such as $NX_3$, $ArX_2$, $KrX_2$, $XeX_2$, $NeX_2$, $HeX_2$, or the like. These may be used alone or in a combination thereof. Here, X may represent F, Cl, Br, I or At.

In an embodiment, $F_2$ may be used as the halogen-containing source.

The boron-containing source and the halogen-containing source may be ionized by, e.g., an electric field generated from the electrode 217 in the ion source chamber 200. Accordingly, the boron-containing ions may be created. The boron-containing ions may include, e.g., $^{11}B^+$, $^{11}BX^+$, $^{11}BX_2^+$, or the like.

In example embodiments, a ratio between boron (B) and halogen (X) (e.g., a ratio of the number of atoms) may be adjusted by controlling flow rates independently from the first ion source flow path 210 and the second ion source flow path 215. In some embodiments, a supply of the boron-containing source through the first ion source flow path 210 may be constantly maintained, and a supply of the halogen-containing source (e.g., $F_2$) may be adjusted so that a relative amount of boron may be controlled.

In some example embodiments, a ratio of the number of boron with respect to the number of halogen (B/X, e.g., B/F) in the total ion source may be adjusted to be greater than about 1/3. For example, a value of B/X may be adjusted to be greater than about 1/2. In some embodiments, the values of B/X may be greater than about 1 or greater than about 2. In this case, boron may be prevalent relatively to halogen in the ion source.

If the value of B/X excessively increases, for example, $^{11}BX^+$ and $^{11}BX_2^+$ may not be sufficiently created. In an embodiment, the value of B/X may be adjusted from about 1/3 to about 10. In an embodiment, the values of B/X may be adjusted from about 1/3 to about 5.

The boron-containing ions created in the ion source chamber 200 may be introduced into the mass analyzer 220 to be separated according to a mass of each ion species. The target ion species may selectively pass through the mass analyzing slit 230.

According to example embodiments as described above, the compound containing $^{11}B$ may be used as the boron-containing source so that different ion species may be substantially and completely separated according to masses thereof. In a comparative example, when a compound containing $^{10}B$ is used as the boron-containing source, for example, $^{10}BH^+$ and $^{11}B^+$ may be created together due to a presence of isotope. Thus, the two ion species may not be separated.

A halogen-combined ion (e.g., $^{11}BF^+$, $^{11}BF_2^+$) among the boron-containing ions may have a relatively increased injection speed, and may have a relatively reduced injection depth (e.g., a projection range (Rp)). $11B^+$ devoid of fluorine may have a relatively small injection speed, and may have a relatively increased injection depth. Thus, the ion species may be properly selected in consideration of a shape of the impurity region 105.

The boron-containing ions through the mass analyzing slit 230 may be accelerated by a high-energy voltage in the ion accelerator 240 so that an ion-beam current may be generated. The ion-beam current may be collected and scanned by the ion lens 250 including, e.g., a quadrupole lens, and the scan plate 260 to be injected onto the wafer 280.

In a comparative example, a boron-fluorine compound such as $BF_3$ may be used as an ion source for injecting boron ions. In this case, a large amount of fluorine ions may be generated from the ion source to cause a by-product such as $WF_6$ from the ion source chamber including tungsten. The by-product may be diffused to other components of the ion-implantation apparatus to cause an operational deterioration. Thus, frequent cleaning and replacement of the ion-implantation apparatus may be needed, and an overall efficiency of a semiconductor fabrication may be reduced.

Accordingly, a reduction of a fluorine ratio in the ion source may be considered for suppressing the generation of the by-product containing fluorine. However, as for $BF_3$, an amount of boron may be also reduced because a stoichiometric ratio of boron and fluorine is fixed as 1:3 (B/F is 1/3). Additionally, an introduction of a dilution gas such as Xe may be considered for diluting fluorine. However, an additional apparatus for the introduction of the dilution gas may be needed, and a concentration of boron may be also reduced.

However, according to example embodiments as described above, the borane-based compound and the halogen-containing source may be independently provided as the ion source, and reacted with each other. Thus, a concentration or an amount of the halogen-containing source may be independently controlled without affecting a concentration of boron. Therefore, the relative amount of boron (e.g., B/X) may increase above about 1/3 as described above.

Accordingly, the generation of the by-product including, e.g., $WF_6$, $F^+$, $WF^+$ and/or $W^+$ may be avoided, and a beam current of the boron-containing ions may be intensified so that an efficiency of the ion-implantation may be improved. Further, a period for cleaning or replacing the ion-implantation apparatus may be extended. Thus, a productivity of the semiconductor fabrication may be improved.

Referring to FIG. 3, the ion-implantation mask 110 may be removed, and an insulating interlayer 120 covering the substrate 100 and the impurity region 105 may be further formed.

In example embodiments, the ion-implantation mask 110 may be removed by an ashing process and/or a strip process.

The insulating interlayer 120 may be formed of a silicon oxide-based material, e.g., plasma enhanced oxide (PEOX), tetraethyl orthosilicate (TEOS), flowable oxide (FOX), or the like. The insulating interlayer 120 may be formed by at least one of a chemical vapor deposition (CVD) process, a plasma enhanced chemical vapor deposition (PECVD) process, a low pressure chemical vapor deposition (LPCVD) process, a high density plasma chemical vapor deposition (HDP-CVD) process, a spin coating process, a sputtering process, a physical vapor deposition (PVD) process and an atomic layer deposition (ALD) process.

The impurity region 105 may serve as a p-type well or a source/drain region formed in the substrate 100. In some embodiments, a conductive structure such as a contact may be formed through the insulating interlayer 120, and may be electrically connected to the impurity region 105.

FIGS. 5 to 9 are cross-sectional views illustrating a method of manufacturing a semiconductor device in accordance with example embodiments. For example, FIGS. 5 to 9 illustrate a method of manufacturing a p-channel metal oxide semiconductor (PMOS) transistor device using the method of forming an impurity region illustrated with reference to FIGS. 1 to 4. Thus, detailed descriptions on processes substantially the same as or similar to those illustrated with reference to FIGS. 1 to 4 are omitted herein.

Figure 5:
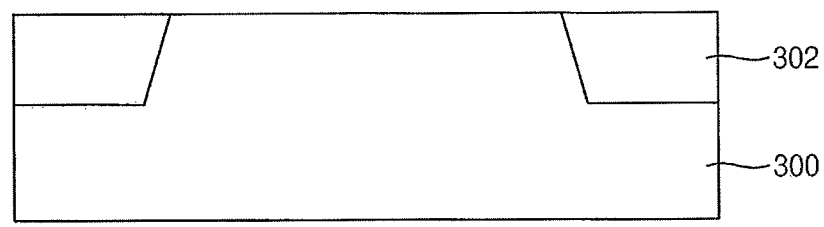

Referring to FIG. 5, an isolation layer 302 may be formed on a substrate 300 to define an active region.

For example, a silicon (Si) substrate, a germanium (Ge) substrate, a silicon-germanium (Si—Ge) substrate, an SOI substrate or a GOI substrate may be used as the substrate 300. The substrate 300 may include a group III-V compound.

The isolation layer 302 may be formed by, e.g., a shallow trench isolation (STI) process. The isolation layer 302 may be formed of silicon oxide. A field region of the substrate 300 may be defined by the isolation layer 302.

Figure 6:
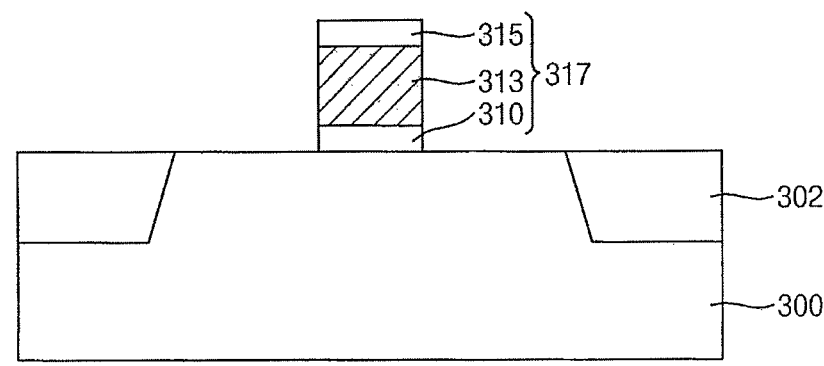

Referring to FIG. 6, a gate structure 317 including a gate insulation pattern 310, a gate electrode 313 and a gate mask 315 may be formed on the active region of the substrate 300.

In example embodiments, a gate insulation layer, a gate electrode layer and a gate mask layer may be sequentially formed on the substrate 300, and may be patterned by a photo-lithography process to form the gate structure 317.

The gate insulation layer may be formed of silicon oxide or a metal oxide. In an embodiment, the gate insulation layer may be formed by a thermal oxidation process on the substrate 300. The gate electrode layer may be formed of a conductive material including, e.g., a metal, a metal nitride, a metal silicide and/or doped polysilicon. The gate mask layer may be formed of silicon nitride.

The gate insulation layer, the gate electrode layer and the gate mask layer may be formed by, e.g., a CVD process, a PVD process or an ALD process.

Figure 7:
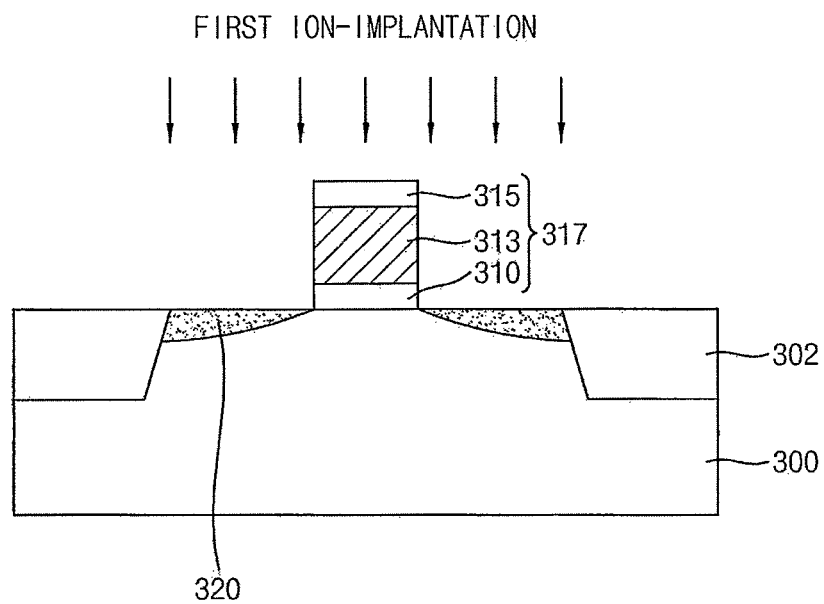

Referring to FIG. 7, a first ion-implantation process may be performed such that a first impurity region 320 may be formed at an upper portion of the substrate 300 adjacent to the gate structure 317.

In example embodiments, boron-containing ions may be implanted by the first ion-implantation process. The first ion-implantation process may include an ion-implantation process substantially the same as or similar to that illustrated with reference to FIGS. 2 to 4.

As described above, a boron-containing source and a halogen-containing source may be introduced independently and concurrently by the first ion-implantation process. The boron-containing source may include a borane-based compound containing $^{11}B$. In an embodiment, a fluorine gas ($F_2$) may be used as the halogen-containing source.

For example, the boron-containing source and the halogen-containing source may be provided into the ion source chamber 200 through the first ion source flow path 210 and the second ion source flow path 215, respectively, as described with reference to FIG. 4. In example embodiments, a flow rate and/or an amount of the halogen-containing source may be independently adjusted so that a relative amount of the boron-containing source may be increased. Thus, a beam current of the boron-containing ions implanted to the substrate 300 may be also intensified. In some embodiments, a ratio between boron and fluorine (B/F) may exceed about 1/3, and may be adjusted to, e.g., at least about 1/2.

The boron-containing ions created in the ion source chamber 200 may be separated through the mass analyzer 220 and the mass analyzing slit 230 to be selectively implanted. In some embodiments, a boron-containing ion having a relatively high injection speed and a relatively small injection depth from the boron-containing ions may be selectively implanted by the first ion-implantation process. For example, $^{11}BF^+$ and/or $^{11}BF^{2+}$ having relatively large masses may be implanted by the first ion-implantation process to form the first impurity region 320. In some embodiments, the first impurity region 320 may serve as lightly doped drain (LDD) region of a PMOS transistor.

In some embodiments, after the formation of the first impurity region 320, a first annealing process may be performed so that the boron-containing ion may be fixed.

Figure 8:
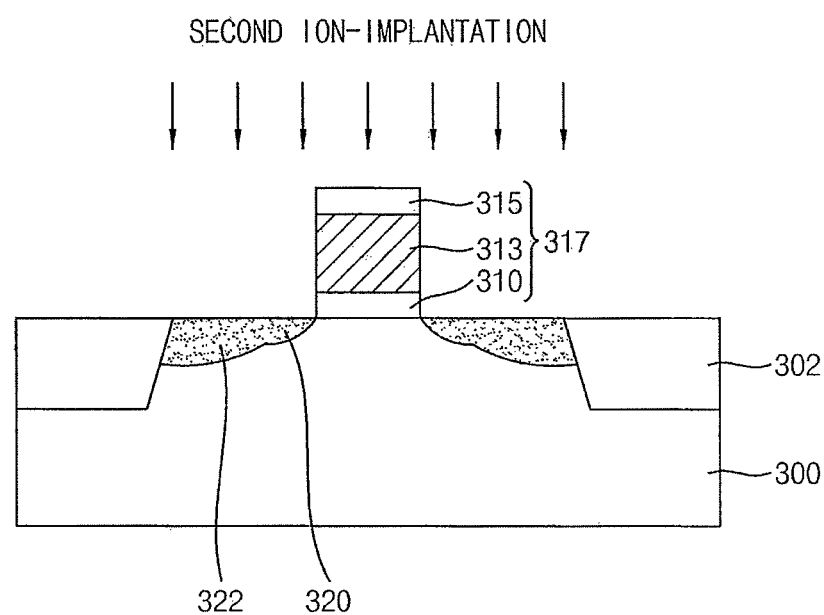

Referring to FIG. 8, a second ion-implantation process may be performed to form a second impurity region 322 expanded from the first impurity region 320.

In example embodiments, the second ion-implantation process may be performed using the boron-containing source and the halogen-containing source, and using a process condition substantially the same as or similar to those used in the first ion-implantation process. In some embodiments, the second and first ion-implantation processes may be performed in-situ. Accordingly, boron-containing ions may be implanted with an intensified beam current.

In some embodiments, a boron-containing ion having a relatively small injection speed and a relatively large injection depth from the boron-containing ions may be selectively implanted by the second ion-implantation process. For example, $^{11}B^+$ and/or $^{11}BF^+$ having relatively small masses may be implanted by the second ion-implantation process to form the second impurity region 322. The second impurity region 322 may be merged with the first impurity region 320, and may have a depth greater than that of the first impurity region 320.

In some embodiments, after the formation of the second impurity region 322, a second annealing process may be performed to fix the boron-containing ion.

The PMOS transistor may be defined on the substrate 300 by the first and second impurity regions 320 and 322, and the gate structure 317. The first and second impurity regions 320 and 322 may serve as s source/drain region of the PMOS transistor.

FIGS. 7 and 8 illustrate that the second impurity region 322 having an expanded depth may be formed after the formation of the first impurity region 320. However, the second impurity region 322 may be formed, and then the first impurity region 320 having a shallow depth may be formed.

Figure 9:
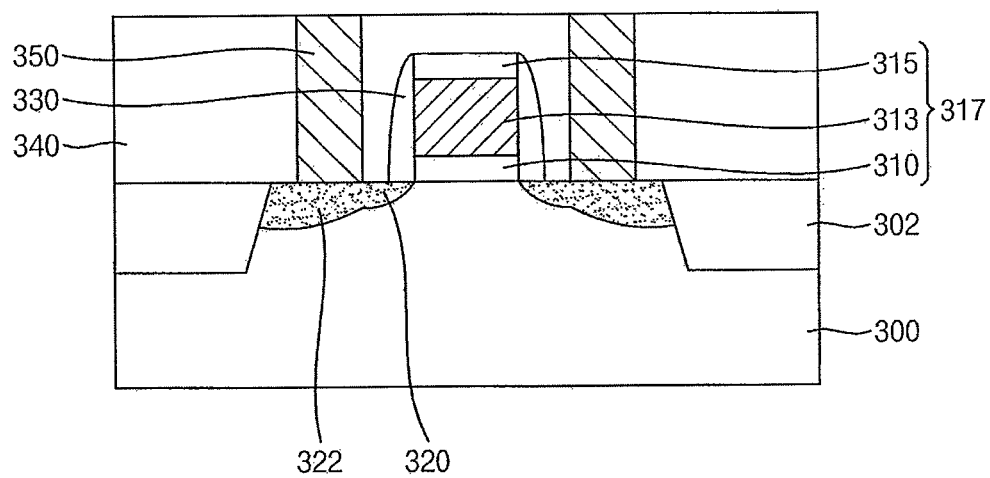

Referring to FIG. 9, an insulating interlayer 340 covering the PMOS transistor may be formed. The insulating interlayer 340 may be formed of silicon oxide, e.g., PEOX, TEOS or FOX by a CVD process.

A plug 350 may be formed through the insulating interlayer 340 to be electrically connected to the first impurity region 320. For example, the insulating interlayer 340 may be partially etched to form a contact hole through which the first impurity region 320 may be exposed. A conductive layer sufficiently filling the contact hole may be formed on the insulating interlayer 340 and the exposed first impurity region 320. An upper portion of the conductive layer may be planarized by, e.g., a CMP process to form the plug 350.

The conductive layer may be formed of a metal, e.g., copper, titanium, tungsten, aluminum, and/or a nitride thereof, by a plating process, a sputtering process, a PVD process, an ALD process, or the like.

As described above, the boron-containing source and the halogen-containing source may be independently and concurrently provided in the ion-implantation process to generate the boron-containing ions. Accordingly, a flow rate and/or an amount of the halogen-containing source may be independently adjusted so that a relative amount of the boron-containing source may be increased. Thus, a beam current of the boron-containing ions may be intensified while suppressing a generation of undesired species, e.g., $F^+$ and $WF^+$.

Additionally, the borane-based compound containing $^{11}B$ may be used as the borane-containing source so that a resolution of separating the boron-containing ions according to masses thereof may be improved. Thus, a projection range of the boron-containing ions may be finely controlled, and the first and second impurity regions 320 and 322 may be formed with desired depths.

Figure 10:
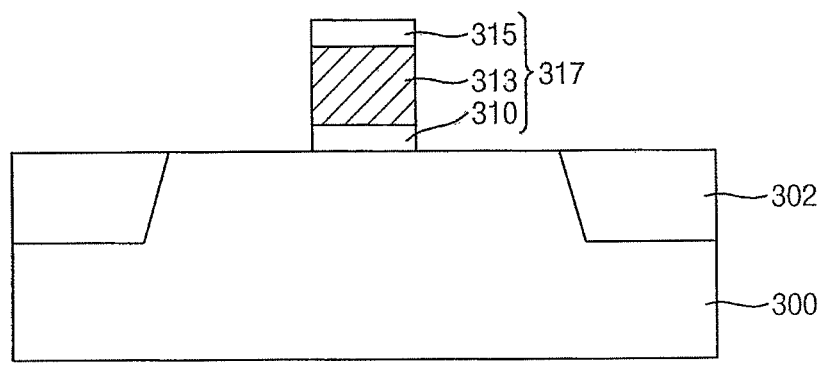
Figure 11:
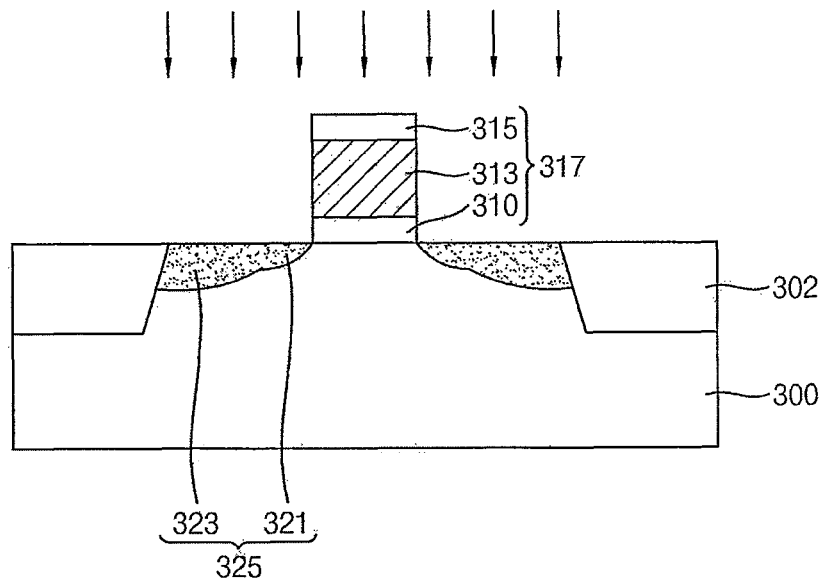
Figure 12:
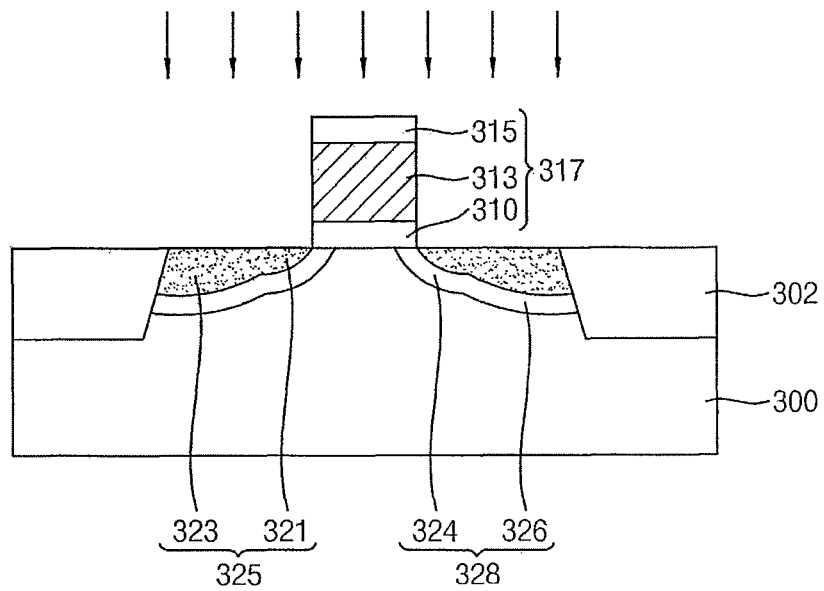

FIGS. 10 to 12 are cross-sectional views illustrating a method of manufacturing a semiconductor device in accordance with example embodiments. For example, FIGS. 10 to 12 illustrate a method of manufacturing an n-channel metal oxide semiconductor (NMOS) transistor device using the method of forming an impurity region illustrated with reference to FIGS. 1 to 4.

Detailed descriptions on processes substantially the same as or similar to those illustrated with reference to FIGS. 1 to 4, and FIGS. 5 to 9 are omitted herein.

Referring to FIG. 10, processes substantially the same as or similar to those illustrated with reference to FIGS. 5 and 6 may be performed.

For example, the isolation layer 302 may be formed on the substrate 300 to define the active region of the substrate 300. The gate structure 317 including the gate insulation pattern 310, the gate electrode 313 and the gate mask 315 may be formed on the active region.

Referring to FIG. 11, n-type impurities may be implanted to form a source/drain region 325 at an upper portion of the substrate 300 adjacent to the gate structure 317. In some embodiments, the source/drain region 325 may include a first impurity region 321 and a second impurity region 323.

For example, an n-type ion source such as phosphine ($PH_3$) may be implanted using the ion-implantation apparatus illustrated in FIG. 4 to form the first and second impurity regions 321 and 323. In some embodiments, the first impurity region 321 may be formed as an LDD region, and then the second impurity region 323 having an expanded depth may be formed.

Referring to FIG. 12, p-type impurities may be implanted to form a halo region 328.

In example embodiments, a p-type ion-implantation process for the halo region 328 may include an ion-implantation process substantially the same as or similar to that illustrated with reference to FIGS. 2 to 4. As described above, a boron-containing source and a halogen-containing source may be introduced independently and concurrently by the p-type ion-implantation process. The boron-containing source may include a borane-based compound containing $^{11}B$. In an embodiment, a fluorine gas ($F_2$) may be used as the halogen-containing source.

As described above, a flow rate and/or an amount of the halogen-containing source may be independently adjusted so that a relative amount of the boron-containing source may be increased. Thus, a beam current of the boron-containing ions implanted to the substrate 300 may be also intensified. In some embodiments, a ratio between boron and fluorine (B/F) may exceed about 1/3, and may be adjusted to, e.g., at least about 1/2.

The boron-containing ions created in the ion source chamber 200 may be separated through the mass analyzer 220 and the mass analyzing slit 230 to be selectively implanted. In some embodiments, a boron-containing ion having a relatively high injection speed and a relatively small injection depth from the boron-containing ions may be selectively implanted by a first halo process with a predetermined tilting angle. For example, $^{11}BF^+$ and/or $^{11}BF^{2+}$ may be implanted by the first halo process to form a first halo region 324.

A second halo process may be further performed to form a second halo region 326 expanded from the first halo region 324.

In some embodiments, a boron-containing ion having a relatively small injection speed and a relatively large injection depth from the boron-containing ions may be selectively implanted by the second halo process. For example, $^{11}B^+$ and/or $^{11}BF^+$ may be implanted by the second halo process to form the second halo region 326. The second halo region 326 may be merged with the first halo region 324, and may have a depth greater than that of the first halo region 324.

In some embodiments, after the formation of the first halo region 324 and/or the second halo region 326, an annealing process may be further performed.

In some embodiments, the second halo region 326 may be formed in advance, and then the first halo region 324 may be formed.

An NMOS transistor including the halo region 328 in which the boron-containing ions may be doped may be formed on the active region of the substrate 300 by the processes as described above.

As illustrated with reference to FIG. 9, an insulating interlayer covering the NMOS transistor may be formed on the substrate 300, and a plug electrically connected to the source/drain region 325 may be formed through the insulating interlayer.

FIGS. 13 to 27 are cross-sectional views illustrating a method of manufacturing a semiconductor device in accordance with example embodiments. For example, FIGS. 13 to 27 illustrate a method of manufacturing a semiconductor device including a fin field-effect transistor (FinFET).

Figure 13:
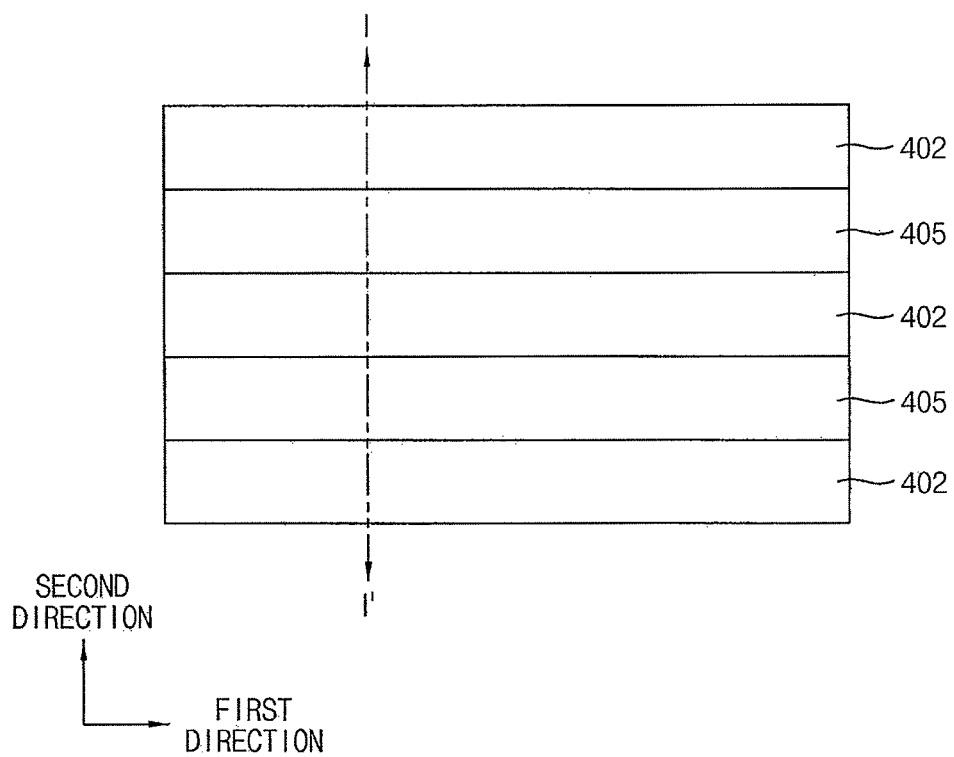
Figure 14:
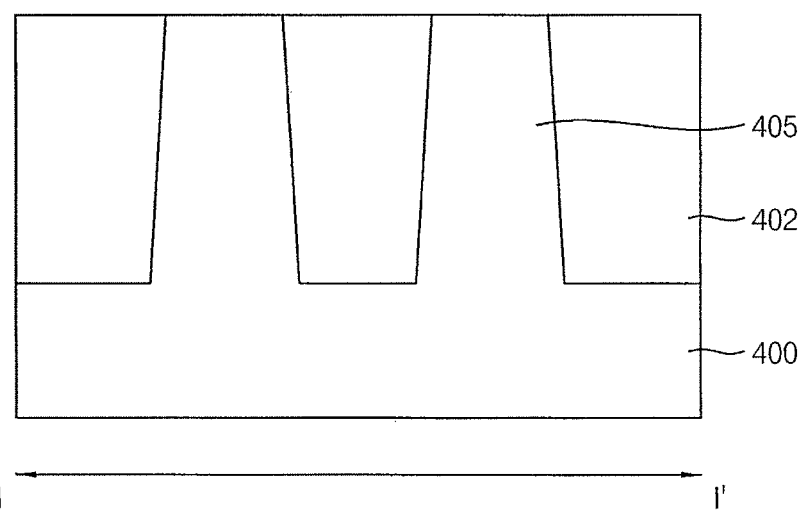
Figure 15:
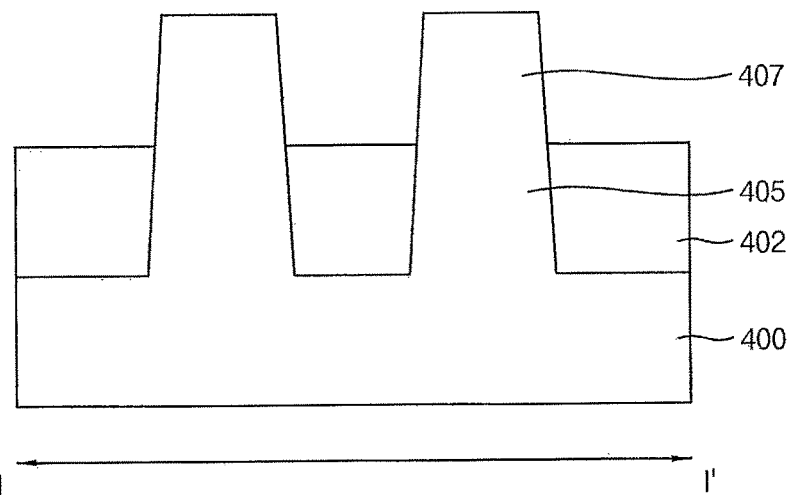
Figure 16:
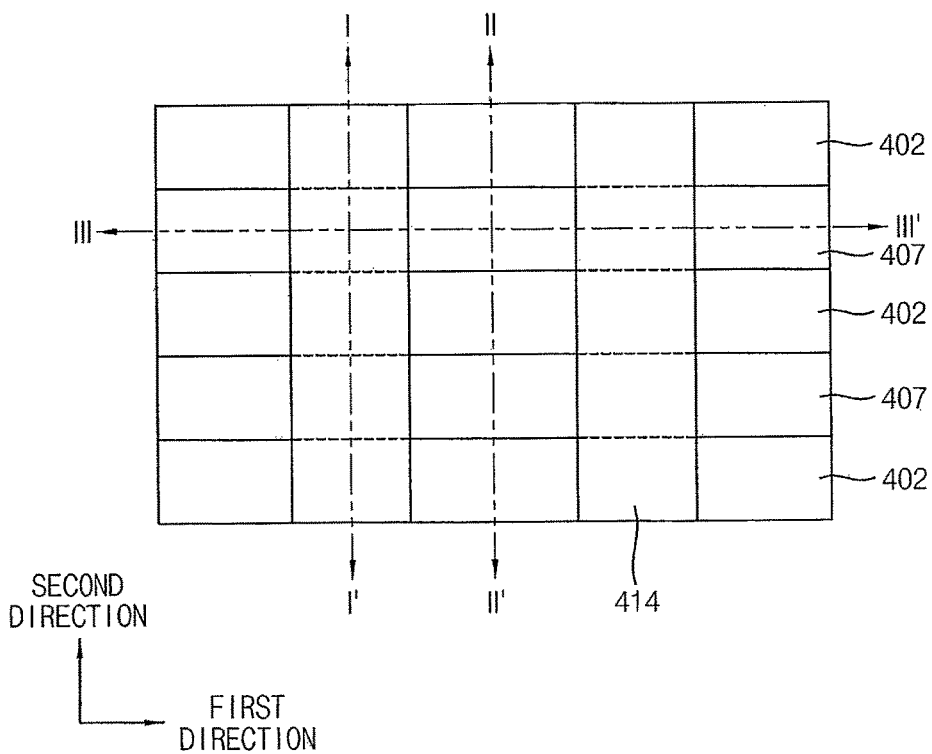
Figure 17:
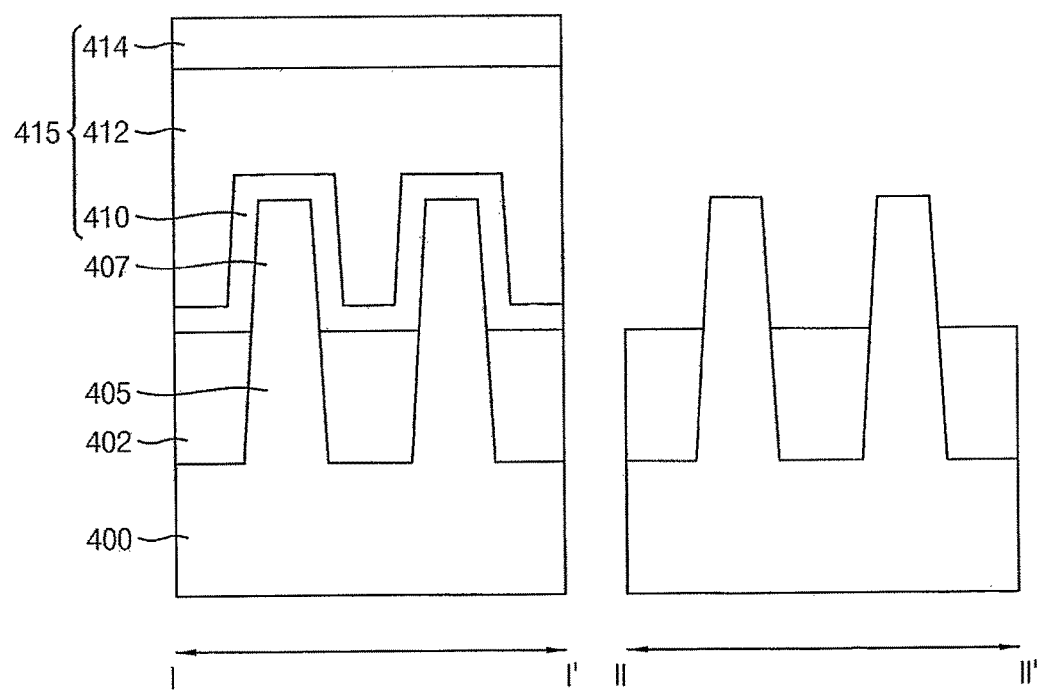
Figure 18:
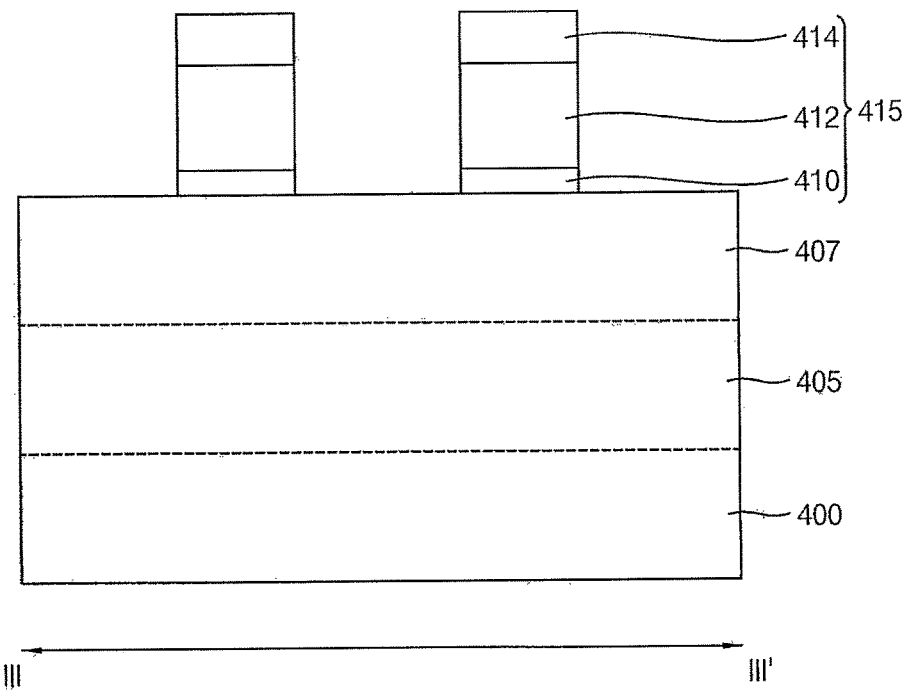
Figure 19:
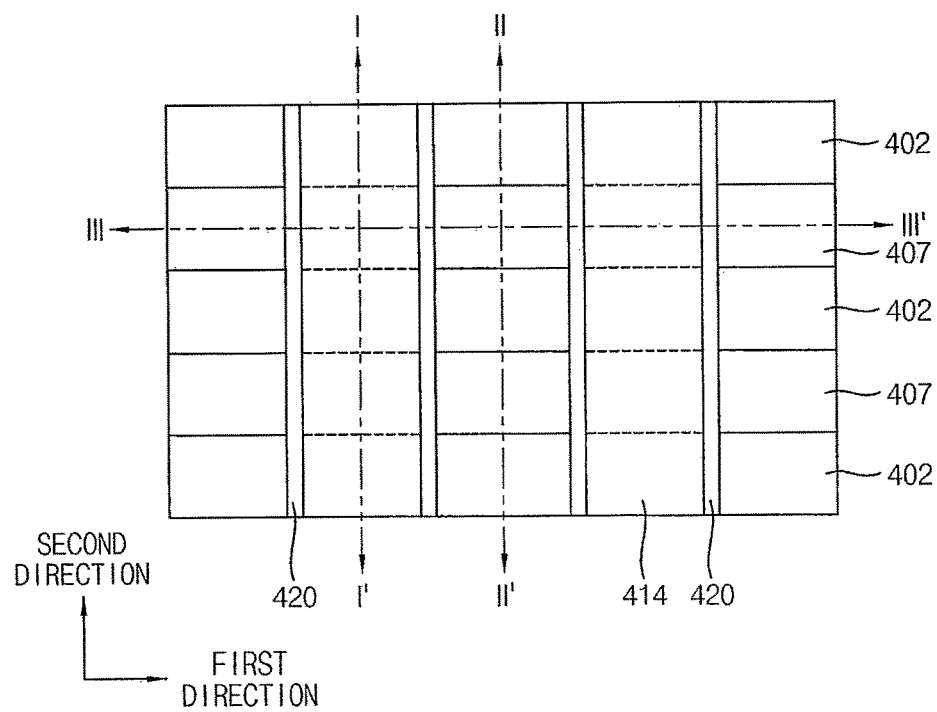

Specifically, FIGS. 13, 16 and 19 are top plan views illustrating the method. FIGS. 14 and 15 are cross-sectional views taken along a line I-I' indicated in FIG. 13. FIGS. 17, 22 and 24 include cross-sectional views taken along lines I-I' and II-II' indicated in FIGS. 16 and 19. FIGS. 18, 20, 21 and 23, and FIGS. 25 to 27 are cross-sectional views taken along a line III-III' indicated in FIGS. 16 and 19.

In FIGS. 13 to 27, two directions substantially parallel to a top surface of a substrate and crossing each other are referred to as a first direction and a second direction. For example, the first direction and the second direction are substantially perpendicular to each other. The direction indicated by an arrow and a reverse direction thereof are considered as the same direction.

Referring to FIGS. 13 and 14, an active pattern 405 protruding form a substrate 400 may be formed.

The substrate 400 may include a semiconductor material such as Si, Ge, Si—Ge, or a group III-V compound such as InP, GaP, GaAs, GaSb, etc. In some embodiments, the substrate 400 may include an SOI substrate or a GOI substrate.

In example embodiments, the active pattern 405 may be formed by a shallow trench isolation (STI) process. For example, an upper portion of the substrate 400 may be partially etched to form an isolation trench, and then an insulation layer sufficiently filling the isolation trench may be formed on the substrate 400. An upper portion of the insulation layer may be planarized by, e.g., a CMP process until a top surface of the substrate 400 may be exposed to form an isolation layer 402. The insulation layer may be formed of, e.g., silicon oxide.

A plurality of protrusions may be formed from the substrate 400 defined by the isolation layer 402. The protrusions may be defined as the active patterns 405. Each active pattern 405 may extend linearly in the first direction, and a plurality of the active patterns 405 may be formed along the second direction.

Referring to FIG. 15, an upper portion of the isolation layer 402 may be removed by, e.g., an etch-back process so that an upper portion of the active pattern 405 may be exposed. The upper portion of the active pattern 405 exposed from a top surface of the isolation layer 402 may be defined as an active fin 407. The active fin 407 may extend in the first direction, and a plurality of the active fins 407 may be arranged along the second direction.

Referring to FIGS. 16, 17 and 18, a dummy gate structure 415 may be formed on the isolation layer 402 and the active fin 407.

For example, a dummy gate insulation layer, a dummy gate electrode layer and a dummy gate mask layer may be sequentially formed on the active fin 407 and the isolation layer 402. The dummy gate mask layer may be patterned by a photo-lithography process to form a dummy gate mask 414. The dummy gate electrode layer and the dummy gate insulation layer may be partially removed using the dummy gate mask 414 as an etching mask to form the dummy gate structure 415.

The dummy gate structure 415 may include a dummy gate insulation pattern 410, a dummy gate electrode 412 and the dummy gate mask 414 sequentially stacked from the active fin 407 and the isolation layer 402.

For example, the dummy gate insulation layer may be formed of silicon oxide. The dummy gate electrode layer may be formed of polysilicon. The dummy gate mask layer may be formed of silicon nitride.

The dummy gate insulation layer, the dummy gate electrode layer and the dummy gate mask layer may be formed by a CVD process, a sputtering process or an ALD process. In an embodiment, the dummy gate insulation layer may be formed by a thermal oxidation process on the active fin 407. In this case, the dummy gate insulation layer may be selectively formed on a top surface of the active fin 407.

As illustrated in FIG. 16, the dummy gate structure 415 may extend in the second direction, and may cross a plurality of the active fins 407. A plurality of the dummy gate structures 415 may be formed along the first direction.

Figure 20:
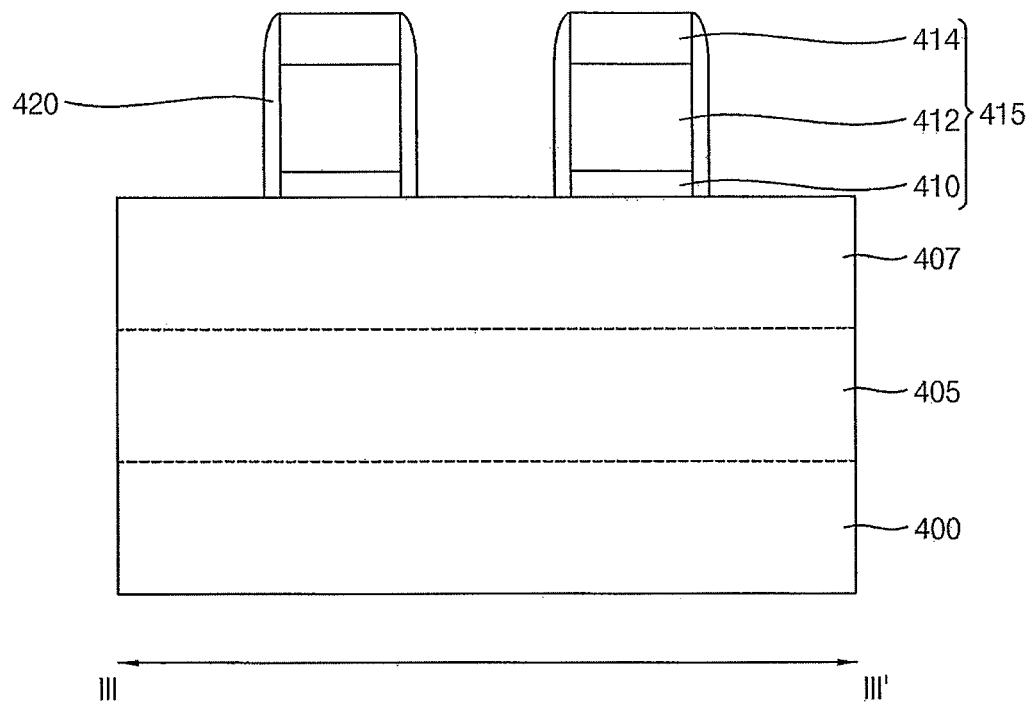

Referring to FIGS. 19 and 20, a gate spacer 420 may be formed on a sidewall of the dummy gate structure 415.

In example embodiments, a spacer layer may be formed on the dummy gate structure 415, the active fin 407 and the isolation layer 402, and the spacer layer may be anisotropically etched to form the gate spacer 420. The spacer layer may be formed of a nitride, e.g., silicon nitride, silicon oxynitride, silicon carbonitride, etc.

As illustrated in FIG. 19, the gate spacer 420 may extend in the second direction together with the dummy gate structure 415.

Figure 21:
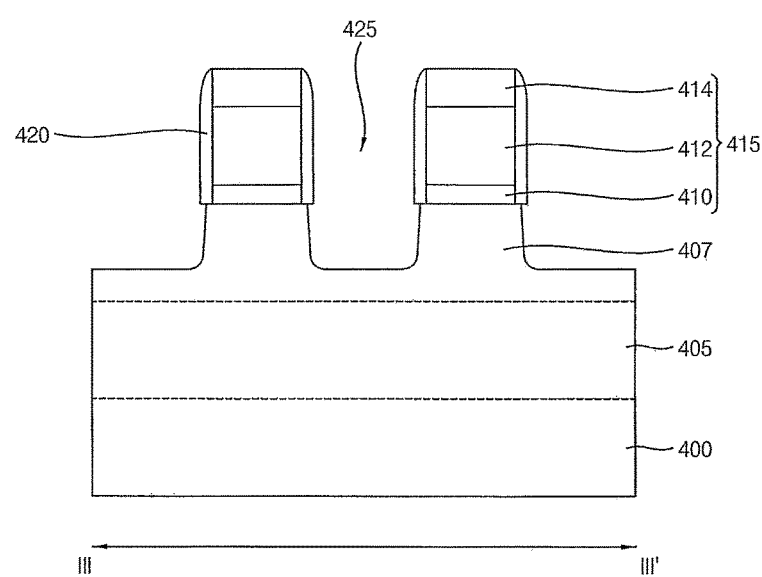
Figure 22:
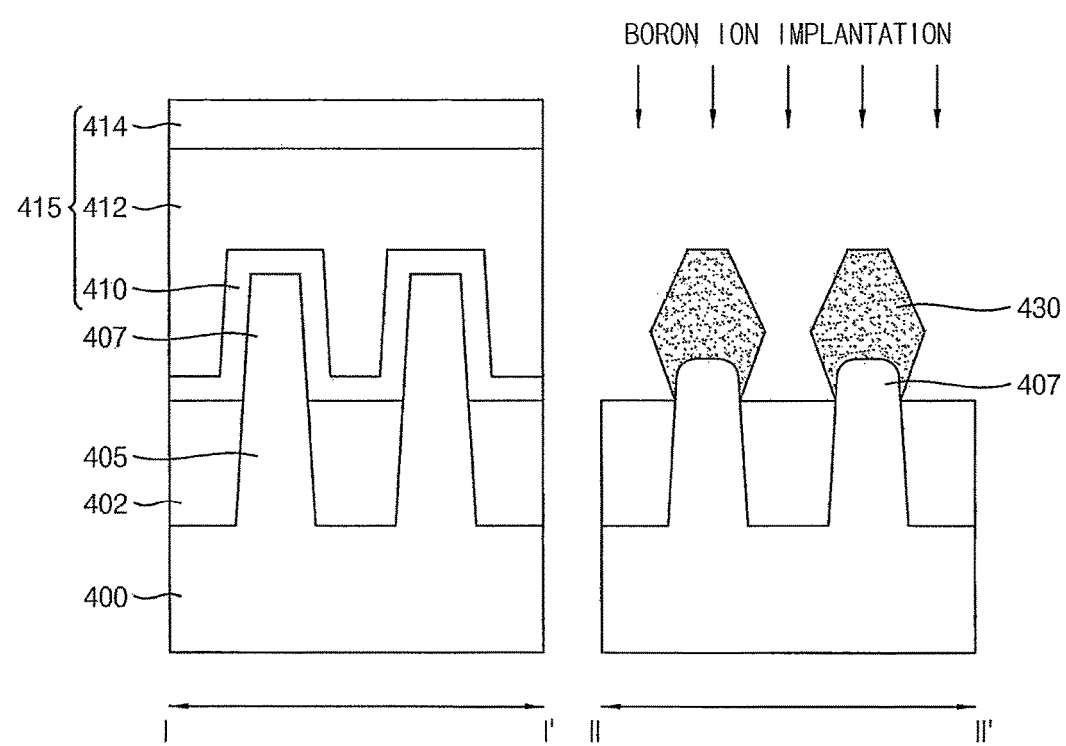

Referring to FIG. 21, an upper portion of the active fin 407 adjacent to the gate spacer 420 and/or the dummy gate structure 415 may be etched to form a recess 425.

In the etching process for the formation of the recess 425, the gate structure 420 may substantially serve as an etching mask. In example embodiments, an inner wall of the recess 425 may have a substantially "U"-shaped profile as illustrated in FIG. 21.

In some embodiments, the recess 425 may be expanded to a portion of the active pattern 405 below the top surface of the isolation layer 402.

Figure 23:
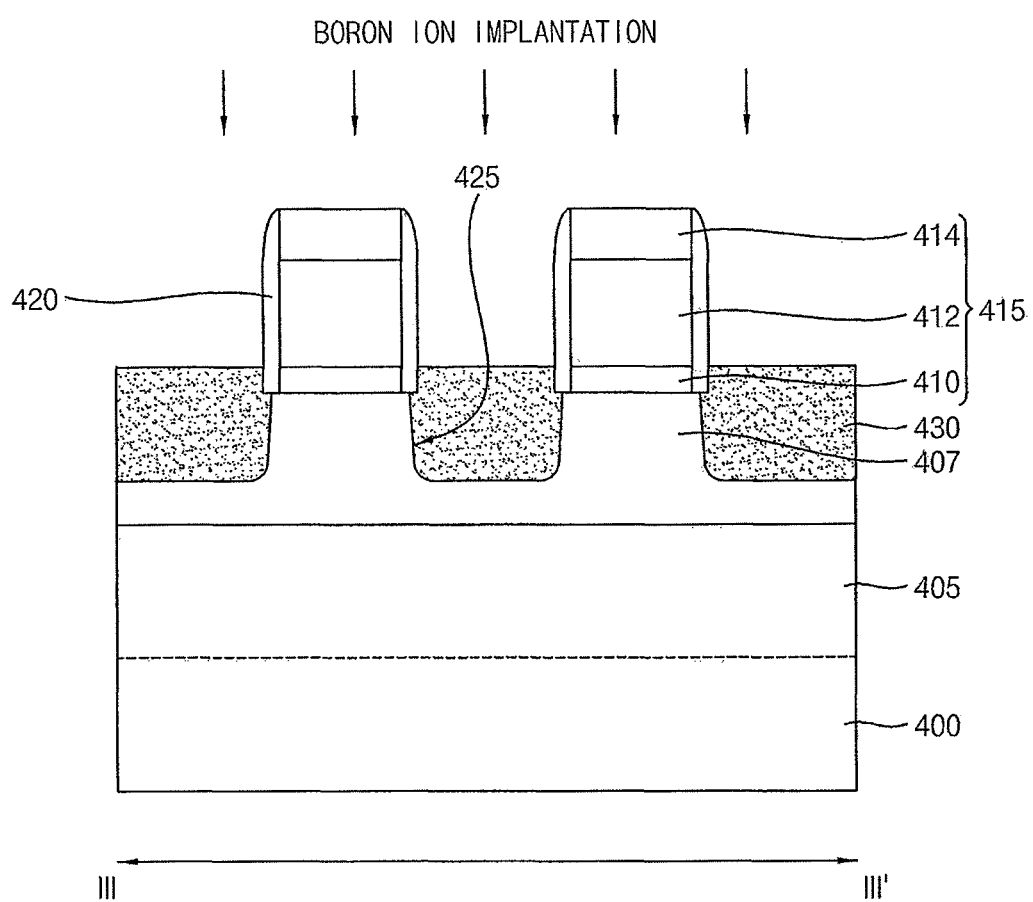
Figure 24:
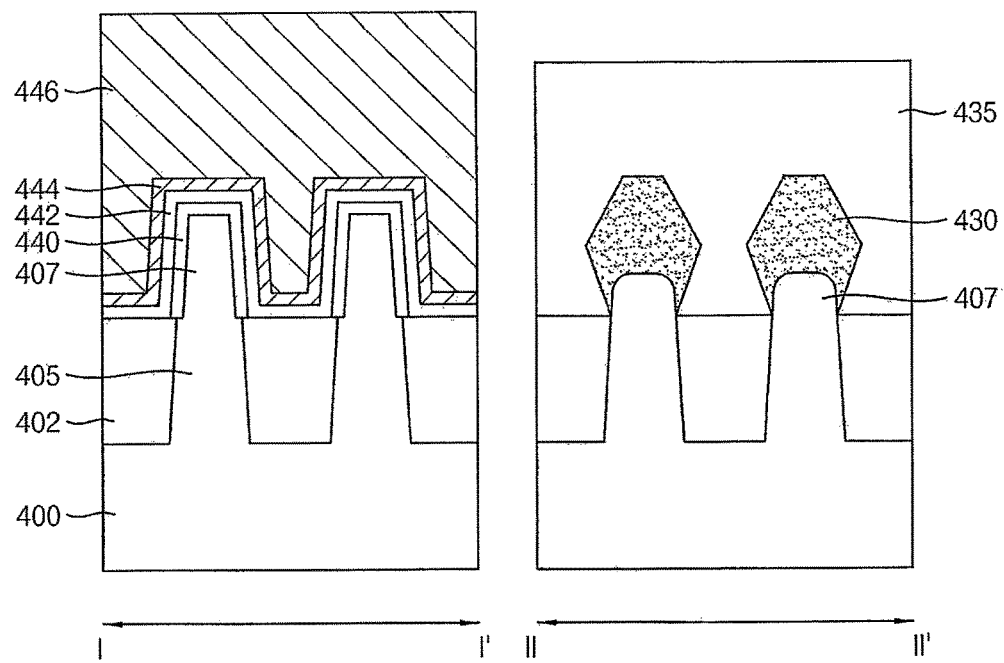

Referring to FIGS. 22 and 23, a source/drain layer 430 filling the recess 425 may be formed.

For example, a selective epitaxial growth (SEG) process may be performed using a top surface of the active pattern 407 exposed by the recess 425 as a seed such that a preliminary source/drain layer filling the recess 425 may be formed. Subsequently, boron-containing ions may be implanted into the preliminary source/drain layer by an ion-implantation process to form the source/drain layer 430.

In example embodiments, the ion-implantation process substantially the same as or similar to that illustrated with reference to FIGS. 2 to 4 may be performed. As described above, a boron-containing source and a halogen-containing source may be introduced independently and concurrently by the ion-implantation process. The boron-containing source may include a borane-based compound containing B. In an embodiment, a fluorine gas ($F_2$) may be used as the halogen-containing source.

In example embodiments, a flow rate and/or an amount of the halogen-containing source may be independently adjusted so that a relative amount of the boron-containing source may be increased. Thus, a beam current of the boron-containing ions implanted into the preliminary source/drain layer may be intensified. In some embodiments, a ratio between boron and fluorine (B/F) may exceed about 1/3, and may be adjusted to, e.g., at least about 1/2.

The source/drain layer 430 may serve as an impurity region of a PMOS-type FinFET. In an embodiment, a germanium source such as germane ($GeH_4$) or germanium tetrachloride ($GeCl_4$) may be also provided during the SEG process. In this case, a compressive stress may be applied through the source/drain layer 430 to improve a hole mobility of a PMOS channel.

The source/drain layer 430 may be grown vertically and laterally to have, e.g., a polygonal cross-section as illustrated in FIG. 22. As illustrated in FIG. 22, one source/drain layer 430 may be formed per each active fin 407. However, the one source/drain layer 430 may be formed from a plurality of the active fins 407. For example, two source/drain layers 430 neighboring in the second direction may be merged with each other.

Figure 25:
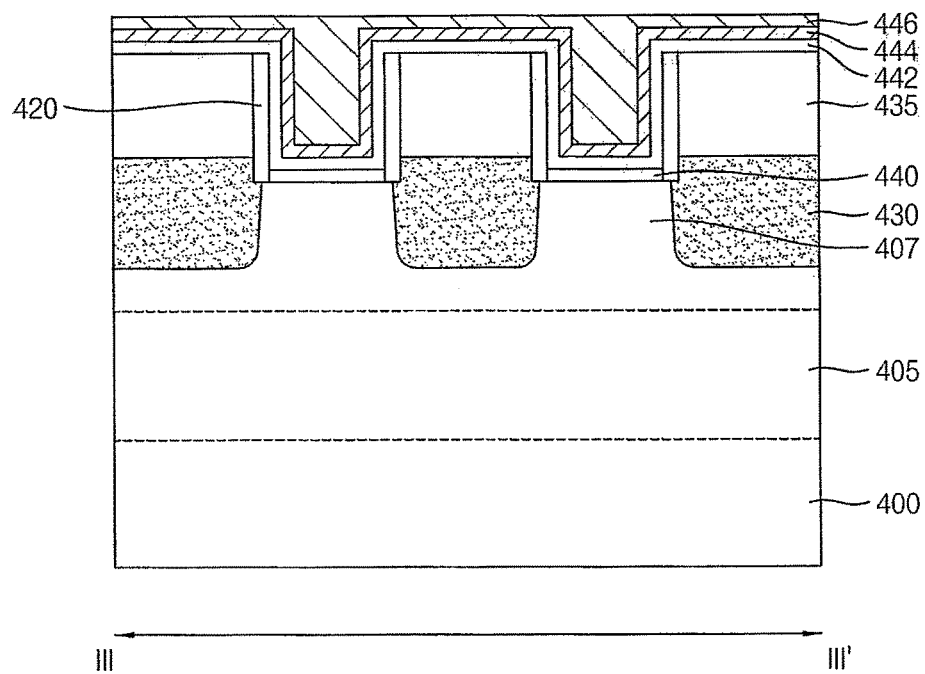

Referring to FIGS. 24 and 25, processes for replacing the dummy gate structure 415 with a gate structure may be performed.

In example embodiments, an insulating interlayer 435 covering the dummy gate structure 415, the gate spacer 420 and the source/drain layers 430 may be formed on the active fin 407 and the isolation layer 402. An upper portion of the insulating interlayer 435 may be planarized by a CMP process and/or an etch-back process until, e.g., a top surface of the dummy gate electrode 412 may be exposed.

The dummy gate mask 414 may be removed by the CMP process, and an upper portion of the gate spacer 420 may be also partially removed. The insulating interlayer 435 may be formed of, e.g., a silicon oxide-based material by a CVD process.

Subsequently, the dummy gate electrode 412 and the dummy gate insulation pattern 410 may be removed. Accordingly, a trench (not illustrated) exposing an upper portion of the active fin 407 may be formed between a pair of the gate spacers 420.

The exposed active fin 407 may be thermally oxidized to form an interface layer 440. A gate insulation layer 442 may be formed along a top surface of the insulating interlayer 435, an inner wall of the trench, and top surfaces of the interface layer 440 and the isolation layer 402, and a buffer layer 444 may be formed on the gate insulation layer 442. A gate electrode layer 446 filling a remaining portion of the trench may be formed on the buffer layer 444.

The gate insulation layer 442 may be formed of a metal oxide having a high dielectric constant (high-k) such as hafnium oxide, tantalum oxide and/or zirconium oxide. The buffer layer 444 may be included for adjusting a work function of a gate electrode. The buffer layer 444 may be formed of a metal nitride such as titanium nitride, tantalum nitride and/or aluminum nitride. The gate electrode layer 446 may be formed of a metal having a low electric resistance such as aluminum, copper, tungsten, or the like.

The gate insulation layer 442, the buffer layer 444 and the gate electrode layer 446 may be formed by a CVD process, an ALD process, a PVD process, etc. In some embodiments, the interface layer 440 may be also formed by a deposition process such as a CVD process or an ALD process. In this case, the interface layer 440 may have a profile substantially the same as or similar to that of the gate insulation layer 442.

Figure 26:
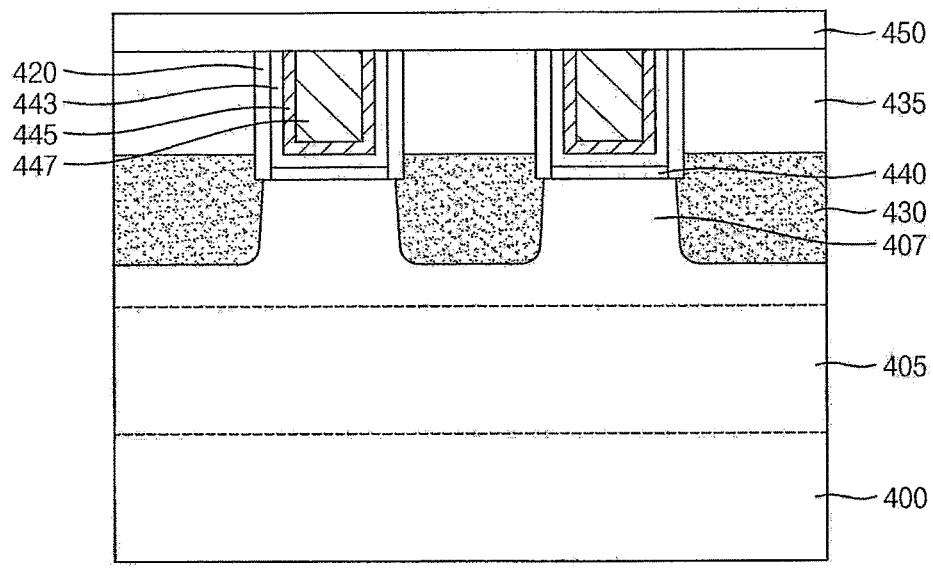

Referring to FIG. 26, upper portions of the gate electrode layer 446, the buffer layer 444 and the gate insulation layer 442 may be planarized by, e.g., a CMP process until the top surface of the insulating interlayer 435 may be exposed.

After the planarization process, the gate structure including the interface layer 440, a gate insulation pattern 443, a buffer pattern 445 and a gate electrode 447 may be defined in the trench. The PMOS-type FinFET may be defined by the gate structure and the source/drain layer 430.

A passivation layer 450 may be formed on the insulating interlayer 435, the gate spacers 420 and the gate structure. The passivation layer 450 may be formed of a nitride-based material such as silicon nitride or silicon oxynitride by a CVD process. A portion of the passivation layer 450 covering the gate structure may serve as a gate mask.

Figure 27:
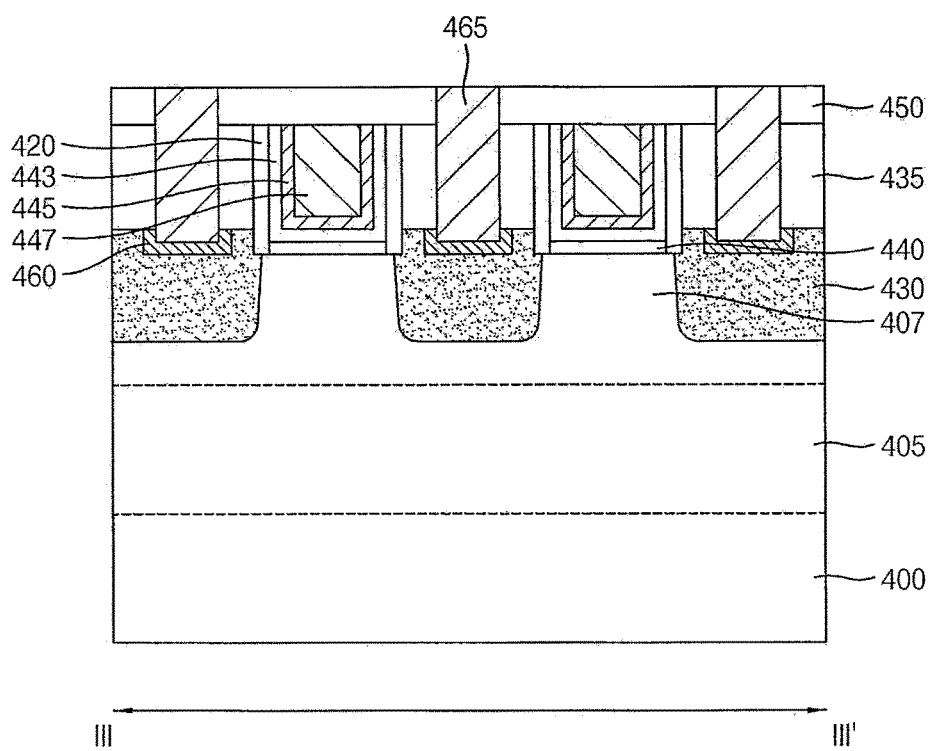

Referring to FIG. 27, a plug 465 electrically connected to the source/drain layer 430 may be formed through the passivation layer 450 and the insulating interlayer 435.

For example, the passivation layer 450 and the insulating interlayer 435 may be partially etched to form a contact hole through which the source/drain layer 430 may be exposed.

In some embodiments, while performing the etching process for the formation of the contact hole, an upper portion of the source/drain layer 430 may be partially removed. Accordingly, the contact hole may be partially inserted into the upper portion of the source/drain layer 430.

In some embodiments, a silicide layer 460 may be formed at the upper portion of the source/drain layer 430 exposed through the contact hole 455. For example, a metal layer may be formed on the source/drain layer 430 exposed through the contact hole, and then a thermal treatment such as an annealing process may be performed thereon. A portion of the metal layer contacting the source/drain layer 430 may be transformed into a metal silicide by the thermal treatment. An unreacted portion of the metal layer may be removed to form the silicide layer 460.

The metal layer may be formed of, e.g., cobalt or nickel. The silicide layer 460 may include, e.g., cobalt silicide or nickel silicide.

In some embodiments, one source/drain layer 430 may be exposed by one contact hole. In some embodiments, the contact hole may be self-aligned with the gate spacer 420. In this case, an outer sidewall of the gate spacer 420 may be exposed by the contact hole.

The plug 465 electrically connected to the source/drain layer 430 may be formed in the contact hole.

For example, a conductive layer sufficiently filling the contact holes may be formed on the passivation layer 450. An upper portion of the conductive layer may be planarized by a CMP process until a top surface of the passivation layer 450 may be exposed to form the plugs 465. The conductive layer may be formed of a metal, a metal nitride, a metal silicide or a doped polysilicon. In some embodiments, a barrier layer including a metal nitride such as titanium nitride may be further formed along an inner wall of the contact hole before forming the conductive layer.

The plug 465 may contact the silicide layer 460. Thus, an electrical resistance between the plug 465 and the source/drain layer 430 may be reduced. In some embodiments, the plug 465 may extend in the second direction, and may be electrically connected to a plurality of the source/drain layers 430.

Hereinafter, properties of an ion-implantation process in accordance with example embodiments will be described in more detail with reference to Experimental Examples.

EXPERIMENTAL EXAMPLE 1

Evaluations on a Generation of by-Product Ions According to B/F Values $^{11}B_2H_6$ and $F_2$ were independently and concurrently provided as a boron-containing source and a halogen-containing source, respectively, into an ion source chamber including tungsten (W), and then an electric field was applied to generate ions. Beam current intensities of by-product ions ($WF^+$, $W^+$, $F^+$) were measured when a ratio between the number of boron and the number of fluorine (B/F) in the ion source chamber was 1/3 (B:F=1:3) and 1/2 (B:F=1:2)

Figure 28:
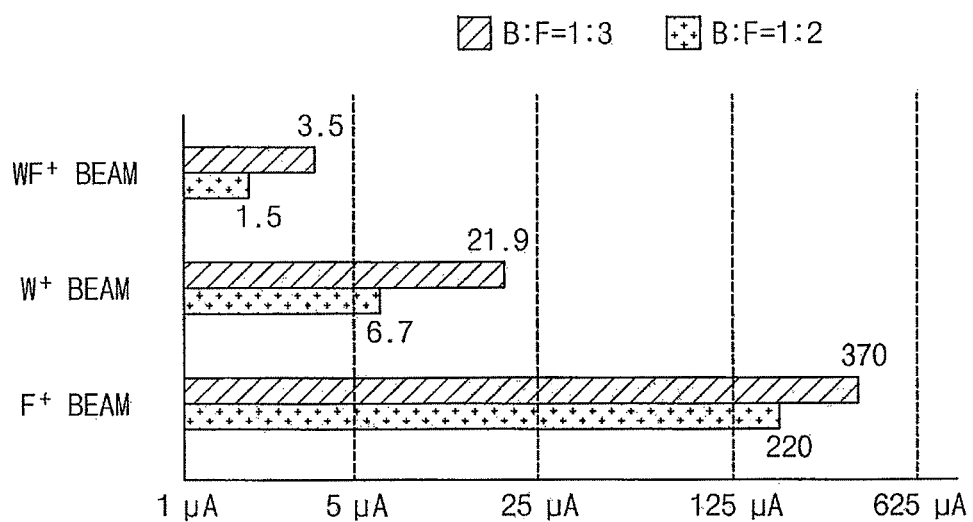

FIG. 28 is a graph showing ion-beam currents of the by-product ions according to ratios of boron and fluorine measured in Experimental Example 1.

Referring to FIG. 28, as a relative amount of boron increased from 1/3 to 1/2, the beam currents of the by-product ions were reduced in all cases. Thus, it was acknowledged that the generation of the by-product ions may be suppressed by reducing a flow rate of the halogen-containing source, and thus a life-time of the ion-implantation apparatus can be extended.

EXPERIMENTAL EXAMPLE 2

Evaluations on a Generation of Boron-Containing Ions According to B/F Values

Beam currents of boron-containing ions were measured when B/F was 1/2 and 1/3 under the same conditions as those of Experimental Example 1. Specifically, a current of $B^+$ was measured at an acceleration voltage of 2 keV and 4 keV, and a current of $BF_2^+$ was measured at an acceleration voltage of 20 keV and 30 keV.

Figure 29:
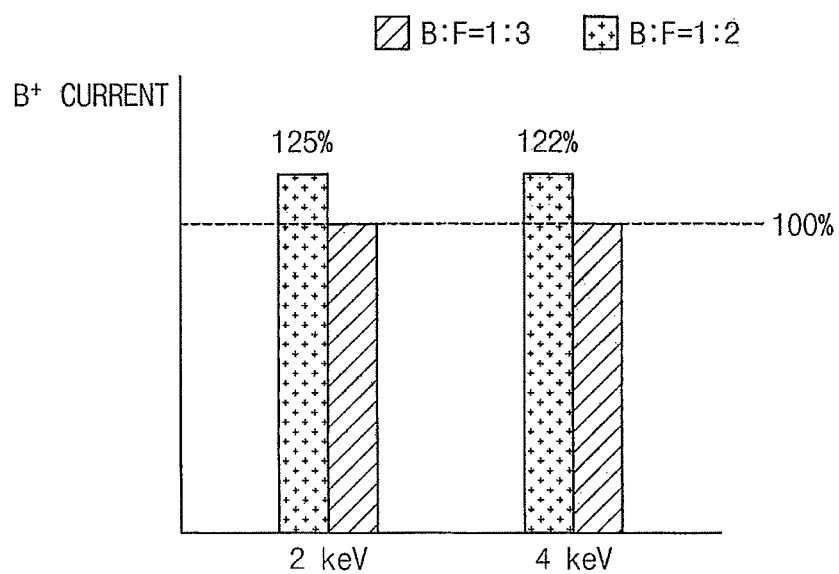
Figure 30:
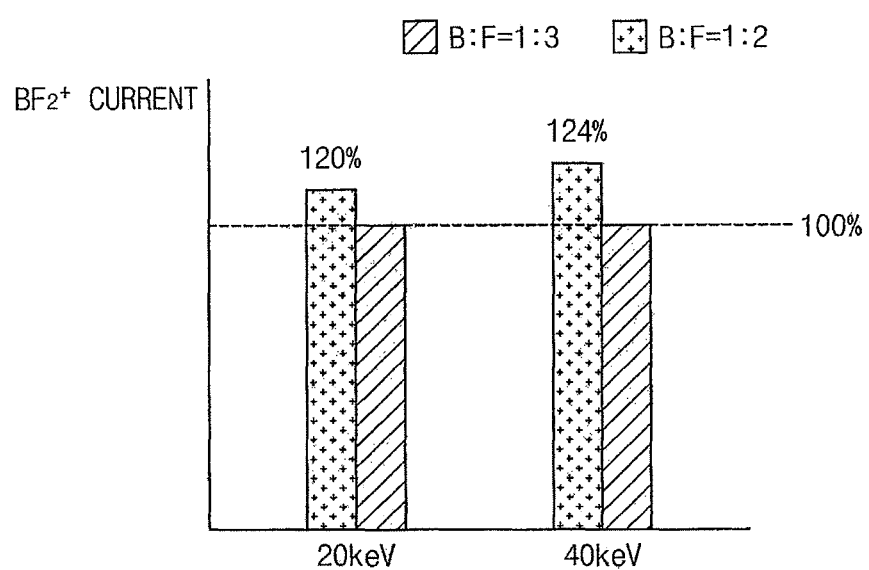

FIGS. 29 and 30 are graphs showing ion-beam currents of the boron-containing ions according to ratios of boron and fluorine measured in Experimental Example 2.

Referring to FIGS. 29 and 30, as a relative amount of boron increased from 1/3 to 1/2, beam currents of the boron-containing ions also increased in all cases. Thus, it was acknowledged that the beam current of the boron-containing ions may be intensified by reducing a flow rate of the halogen-containing source, and thus an efficiency of an ion-implantation process may be improved.

According to example embodiments, in an ion-implantation process for forming a p-type impurity region, a borane-based compound containing $^{11}B$ may be used as a boron source while providing a halogen source, e.g., a fluorine gas ($F_2$). The halogen source may be provided independently with respect to the boron source, so that a concentration or an amount of halogen ions may be controlled without reducing a concentration or an amount of boron ions. Thus, an intensity of the boron ions (e.g., an intensity of a boron ion current) may increase while preventing a deterioration of an ion-implantation apparatus caused by, e.g., fluorine ions.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
   preparing a semiconductor substrate;
   providing a boron-containing source and a halogen-containing source independently and concurrently into a chamber of an ion-implantation apparatus, the boron-containing source including a borane-based compound including boron having a mass number of 11, the halogen-containing source including one or more of $X_2$, $NX_3$, $ArX_2$, $KrX_2$, $XeX_2$, $NeX_2$, or $HeX_2$, where X is fluorine, chlorine, bromine, iodine, or astatine; and
   generating boron-containing ions by reacting the borane-based compound and the halogen-containing source with each other, the generated boron-containing ions including one or more of $^{11}BX_2^+$, $^{11}BX^+$, or $^{11}B^+$, wherein a relative amount of $^{11}BX_2^+$, $^{11}BX^+$, and $^{11}B^+$ generated by reacting the borane-based compound and the halogen-containing source is controlled by controlling an amount of the halogen-containing source provided into the chamber, thereby adjusting a ratio of a number of boron atoms with respect to a number of halogen atoms provided into the chamber; and
   implanting the boron-containing ions into the semiconductor substrate to form an impurity region.

2. The method of claim 1, wherein the borane-based compound is represented by the following Chemical Formula:

$^{11}B_xH_y$  [Chemical Formula]

wherein, in Chemical Formula, x is an integer equal to or greater than 2, and y is an integer equal to or greater than 6.

3. The method of claim 1, wherein the halogen-containing source includes one or more of $X_2$, $NX_3$, $ArX_2$, $KrX_2$, $XeX_2$, $NeX_2$, or $HeX_2$, and X is fluorine.

4. The method of claim 1, wherein the borane-based compound includes $^{11}B_2H_6$, and the halogen-containing source includes $F_2$.

5. The method of claim 1, wherein the ratio of the number of boron atoms with respect to the number of halogen atoms is adjusted to be greater than about 1/3.

6. The method of claim 5, wherein the ratio of the number of boron atoms with respect to the number of halogen atoms is adjusted to at least about 1/2.

7. The method of claim 1, wherein ions devoid of boron are also generated by reacting the borane-based compound and the halogen-containing source, the method further comprising increasing a current intensity of the boron-containing ions relatively compared to the ions devoid of boron by controlling a supply of the halogen-containing source.

8. The method of claim 1, wherein:

the boron-containing ions include a plurality of ion species having different masses, and implanting the boron-containing ions includes a selective implantation by separating the plurality of ion species according to the masses thereof.

9. The method of claim 1, wherein the impurity region serves as a well region or a source/drain region.

10. A method of manufacturing a semiconductor device, the method comprising:

forming a gate structure on a substrate;

providing a boron-containing source including a borane-based compound and a halogen-containing source independently and concurrently into a chamber of an ion-implantation apparatus, the borane-based compound including boron having a mass number of 11, the halogen-containing source including one or more of $X_2$, $NX_3$, $ArX_2$, $KrX_2$, $XeX_2$, $NeX_2$, or $HeX_2$, where X is fluorine, chlorine, bromine, iodine, or astatine;

generating boron-containing ions by reacting the borane-based compound and the halogen-containing source with each other, the generated boron-containing ions including one or more of $^{11}BX_2^+$, $^{11}BX^+$, or $^{11}B^+$, wherein a relative amount of $^{11}BX_2^+$, $^{11}BX^+$, and $^{11}B^+$ generated by reacting the borane-based compound and the halogen-containing source is controlled by controlling an amount of the halogen-containing source provided into the chamber, thereby adjusting a ratio of a number of boron atoms with respect to a number of halogen atoms provided into the chamber;

implanting the boron-containing ions at an upper portion of the substrate adjacent to the gate structure to form an impurity region.

11. The method of claim 10, wherein:

the boron-containing ions include a plurality of ion species having different masses, and implanting the boron-containing ions to form the impurity region includes:

forming a first impurity region in which an ion species having a relatively large mass of the plurality of ion species is implanted; and forming a second impurity region in which an ion species having a relatively small mass of the plurality of ion species is implanted, the second impurity region having a depth greater than that of the first impurity region.

12. The method of claim 10, further comprising:

forming an isolation layer on the substrate; and partially removing an upper portion of the isolation layer to form an active fin that protrudes from a top surface of the isolation layer, wherein the gate structure crosses the active fin on the isolation layer.

13. The method of claim 12, wherein the impurity region is formed at an upper portion of the active fin adjacent to the gate structure.

14. The method of claim 10, further comprising implanting n-type impurities at the upper portion of the substrate before implanting the boron-containing ions, wherein the impurity region serves as a halo region.

15. A method of manufacturing a semiconductor device, the method comprising:

preparing a semiconductor substrate;

providing a boron-containing source and a fluorine-containing source independently into a chamber of an ion-implantation apparatus, the boron-containing source including a borane-based compound containing boron having a mass number of 11, and the fluorine-containing source including one or more of $F_2$, $NF_3$, $ArF_2$, $KrF_2$, $XeF_2$, $NeF_2$, or $HeF_2$;

generating boron-containing ions by reacting the boron-containing source and the fluorine-containing source with each other, the generated boron-containing ions including one or more of $BF_2^+$, $^{11}BF^{+1}$, or $^{11}B^{+1}$, wherein a relative amount of $^{11}BF_2^+$, $^{11}BF^+$, and $^{11}B^+$ generated by reacting the boron-containing source and the fluorine-containing source is controlled by controlling an amount of the fluorine-containing source provided into the chamber, thereby adjusting a ratio of a number of boron atoms with respect to a number of fluorine atoms provided into the chamber; and implanting the boron-containing ions into the semiconductor substrate to form an impurity region.

16. The method of claim 15, further comprising adjusting a relative ratio of boron atoms with respect to fluorine atoms, to at least about 1/3.

* * * * *